United States Patent [19]
Kim

[11] Patent Number: 5,358,903
[45] Date of Patent: Oct. 25, 1994

[54] CONTACT OF A SEMICONDUCTOR DEVICE AND ITS MANUFACTURING PROCESS

[75] Inventor: Jae K. Kim, Kyoungki, Rep. of Korea

[73] Assignee: Hyundai Electronics Industries Co. Ltd., Rep. of Korea

[21] Appl. No.: 77,136

[22] Filed: Jun. 15, 1993

[30] Foreign Application Priority Data

Jun. 16, 1992 [KR] Rep. of Korea ............. 92-10445

[51] Int. Cl.⁵ .................................. H01L 21/283
[52] U.S. Cl. .................................. 437/195; 437/50; 437/192; 437/228; 437/984; 148/DIG. 20
[58] Field of Search ............. 437/195, 192, 193, 191, 437/50, 228, 984

[56] References Cited

U.S. PATENT DOCUMENTS

| | | | |
|---|---|---|---|
| 4,654,113 | 3/1987 | Tuchiya et al. | 156/643 |
| 4,866,009 | 9/1989 | Matsuda | 437/203 |
| 4,874,719 | 10/1989 | Kurosawa | 437/195 |
| 4,900,695 | 2/1990 | Takahashi et al. | 437/195 |
| 4,948,756 | 8/1990 | Ueda | 437/195 |
| 5,169,802 | 12/1992 | Yeh | 437/195 |

*Primary Examiner*—T. N. Quach
*Attorney, Agent, or Firm*—Fish & Richardson

[57] ABSTRACT

A contact of a semiconductor device and its manufacturing process are disclosed. A first conducting line, a first insulating layer, and a second conducting line are formed sequentially on a semiconductor substrate. And then, a second insulating layer is deposited on the substrate and photomasking process for making a contact is proceeded. A contact hole is formed by etching sequentially portions of the second insulating layer, the second conducting line, and the first insulating layer in order to expose a portion of the first conducting line. Thereafter, conductive material for a contact plug is filled in the contact hole in order to connect the first conducting line to the second conducting line.

6 Claims, 6 Drawing Sheets

CONTACT OF A SEMICONDUCTOR DEVICE AND ITS MANUFACTURING PROCESS

BACKGROUND OF THE INVENTION

1. Field of the Invention

This invention relates to a highly integrated semiconductor device, and more particularly, to a contact of semiconductor device used to improve the integrity of the semiconductor device by minimizing the line width of an upper conducting line that forms on the contact area and prevent damages on a lower conducting line when the upper conducting line makes contact with the lower conducting line.

2. Background of the Invention

During the semiconductor fabricating process, a conducting line is formed on a semiconductor substrate and an insulating layer is formed over the conducting line. And then the conducting line makes contact with another conducting line overlying the insulating layer. In general, after the formation of the lower conducting line and the insulating layer overlying the lower conductive line, a contact hole is made at a selected area to expose a portion of the lower conducting line and a conducting material is filled in the contact hole. Thereafter, a conducting layer is formed on the insulating layer and on the contact hole, and patterned to make an upper conducting line.

However, the patterning of the upper conducting line should be performed in such a way that the upper conducting line completely becomes overlaps with an upper surface of the contact hole or a contact area. If the upper conducting line fails to overlap with the contact area, the lower conducting line of the lower part of the contact is damaged during the patterning process, resulting in a defective device. Therefore, the lower and upper conducting lines must be formed by observing a certain design rule. That is, in order to make the upper conducting line contact with the lower conducting line, the upper conducting line must always overlap with the contact area. However, because the registration, CD (Critical Dimension) variation, misalignment tolerance, and the lens distortion must be considered during the patterning and/or masking process, the line width of the upper conducting line should be larger than the size of the contact. As a result, the high integrity of the device is lost.

SUMMARY OF THE INVENTION

Accordingly, the objective of the present invention is to provide a contact of the semiconductor device used to improve the integrity of the semiconductor device.

DETAILED DESCRIPTION OF THE INVENTION

The present invention now will be explained in detail by referring to the accompanying drawings.

Figure 1:
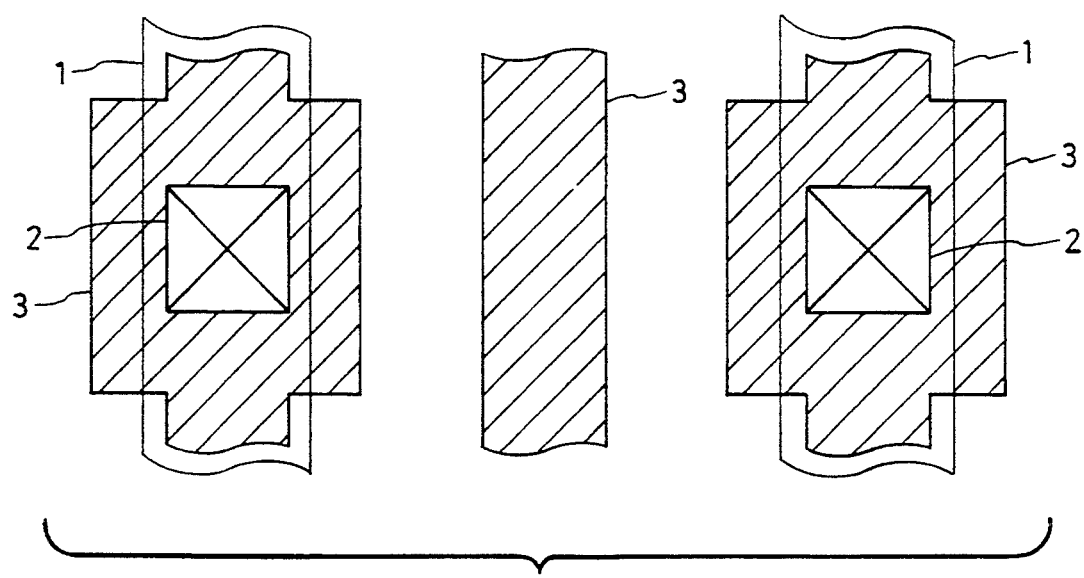
FIG. 1 is a layout diagram illustrating the arrangement of a first conducting line mask, a contact mask, and a second conducting line mask used to make the second conducting line contact with the first conducting line in the prior art.

FIG. 1 is a layout diagram illustrating the arrangement of the first conducting line mask 1, contact mask 2, and the second conducting line mask 3. They are arranged this way in order to contact a first conducting line, i.e., a lower conducting line to a second conducting line, i.e., an upper conducting line. As shown in FIG. 1, the second conducting line completely overlaps with the contact area after the increase of the line width that corresponds to the contact area. However, as shown in FIG. 1, if the line width of the second conducting line which is to be overlapped at the contact area is formed larger than the first conducting line, the integrity of the semiconductor device decreases.

Figure 2A:
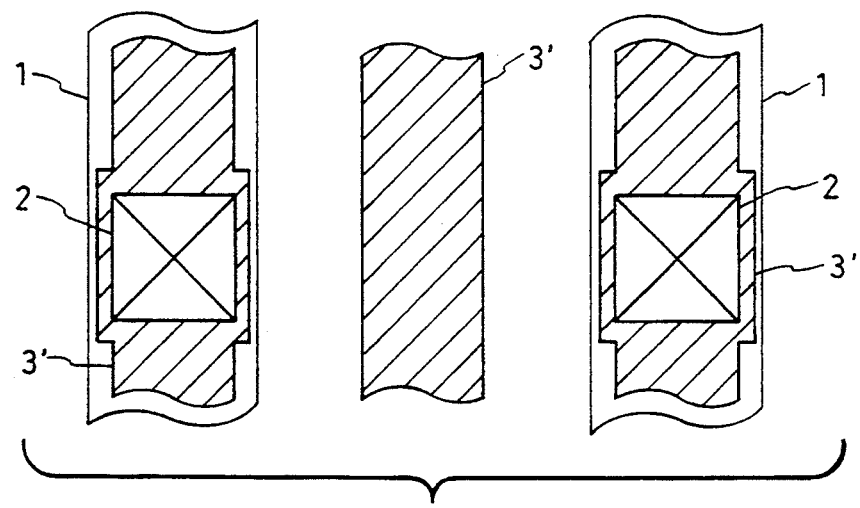
FIG. 2A is a layout diagram illustrating the arrangement of the first conducting line mask, contact mask, and the second conducting line mask used to minimize the line width of the second conducting line at the contact area in order to improve the integrity.

FIG. 2A is a layout diagram which is similar to FIG. 1 except that the line width of the second conducting line of the contact area is reduced to less than that of the first conducting line in order to increase the integrity. The second conducting line mask 3 that is formed larger than the line width of the contact is arranged in such a way that it overlaps with the first conducting line mask 1 and contact mask 2. Here, FIG. 2A illustrates that each mask is normally arranged without any misalignment.

Figure 2B:
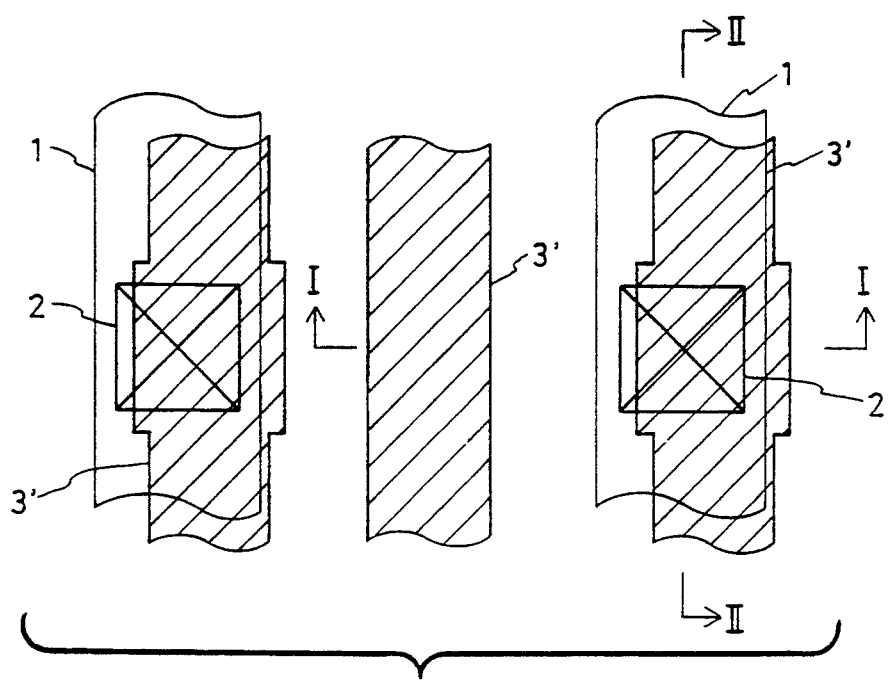
FIG. 2B is a layout diagram depicting the misalignment of the second conducting line mask after arranging the first conducting line mask and contact mask as shown in FIG. 2A.

FIG. 2B illustrates the following; the second conducting line mask 3 where the line width of the second conducting line which overlaps with the contact area is formed smaller than the width of the line of the first conducting line and yet larger than the width of the line of contact is arranged in such a way that the second conducting line mask is misaligned toward the sight of the arranged position of the first conducting line mask 1 and contact mask 2. It should be noted that the line width of the second conducting line that overlaps with the contact area can be formed to be the same in width as the line width of the contact.

Figure 3A:
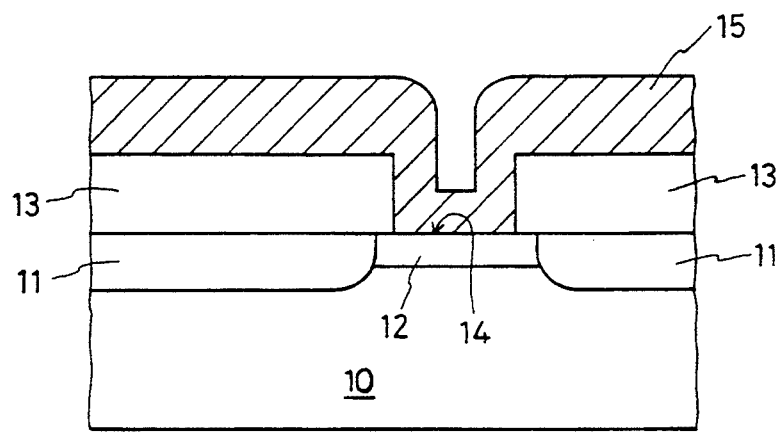
FIG. 3A and FIG. 3B are cross-sectional views shown along I—I of FIG.2B illustrating the manufacturing process of the contact using the conventional processing method.
Figure 3B:
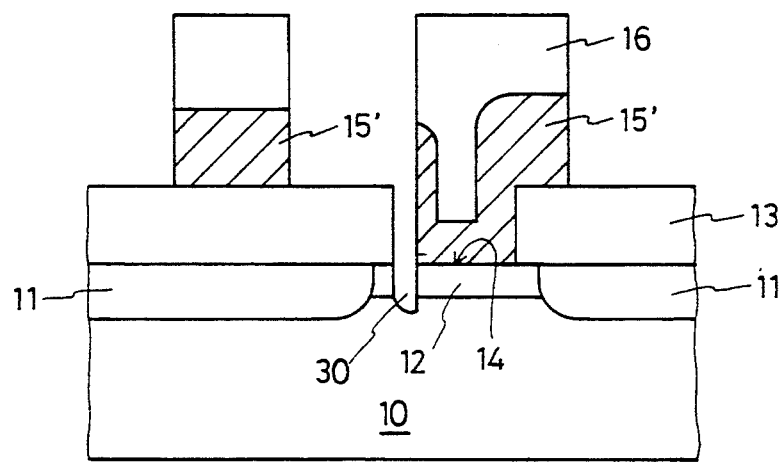

FIG. 3A and FIG. 3B are cross-sectional views shown along I—I of FIG. 2B. The line width of the second conducting line that overlaps with the contact area is minimized and the second conducting line makes contact with the first conducting line using the conventional technique while the photoresist pattern for the second conducting line does not fully overlap with the contact hole, due to misalignment or CD variation.

As shown in FIG. 3A, a field oxide layer 11 is formed on a certain past of a semiconductor substrate 10 and a first conducting line 12 is formed by injecting dopants into the exposed substrate. An insulating layer 13 is coated over the top of the entire semiconductor substrate and then, a contact hole 14 with the exposed first conducting line 12 is formed by etching a certain part of the insulating layer 13 using the contact mask. Next, a second conducting layer 15 is formed over the entire semiconductor substrate. The second conducting layer 15, comprising of polysilicon, can be used as a bit line.

Next, a photoresist pattern 16 for the second conducting line is formed and then, the second conducting line 15' is formed by etching the second conducting layer 15 that had been exposed as a result of using the photomasking process as shown in FIG. 3B. It should be noted that the second conducting layer 15 inside of the contact hole 14 is etched out because the photoresist pattern 16 for the second conducting line fails to completely overlap with the contact hole and a hole 30 is formed in the first conducting line 12 after the first conducting line 12 of the lower part of the contact hole 14 is etched when carrying out the over etching due to the difference in topology of other areas not illustrated.

As described above, the first conducting line 12 is damaged when the photoresist pattern for the second conducting line fails to completely overlap with the contact hole 14 using the conventional processing method.

FIG. 4A through FIG. 4E are cross-sectional views shown along I—I of FIG. 2B that illustrate the following; the line width of a second conducting line of contact area is minimized and a photoresist pattern for the second conducting line fails to fully overlap with a contact hole due to misalignment or CD variation and then, the second conducting line makes contact with a conducting line using the method of the present invention.

Figure 4A:
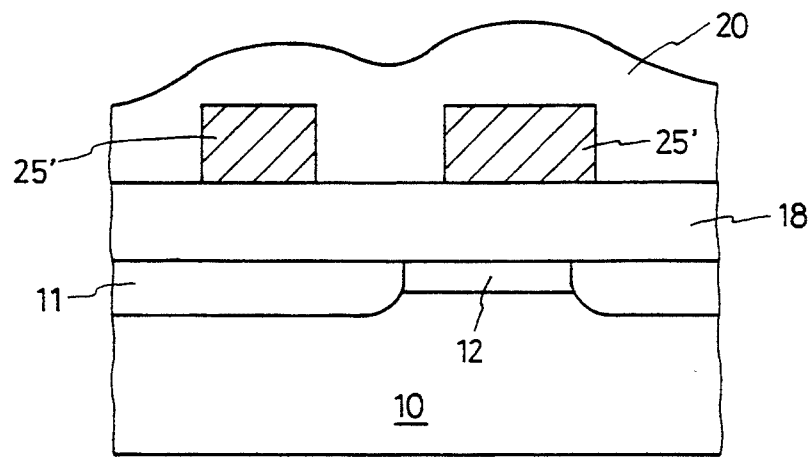
FIG. 4A through FIG. 4E are cross-sectional views shown along I—I of FIG. 2B illustrating a contact manufacturing process of the present invention.

FIG. 4A is a cross-sectional view illustrating the semiconductor device. A field oxide layer 11 is formed on a certain past of the semiconductor substrate 10 and then, the dopants are injected into the exposed semiconductor substrate 10 to form the first conducting line 12. Next, a first insulating layer 18 is formed on top of the entire substrate. On top of the first insulating layer 18, a second conducting layer 25 is deposited and a second conducting line 25' is formed through the pattern processing, by using the mask for second conducting line. And then, on top of the entire semiconductor device, including the second conducting line 25', the second insulating layer 20, for example, BPSG(Boro Phospho Silicate Glass) or a two-layered structure consisting of USG (Undoped Silicate Glass) and BPSG is formed. As seen in FIG. 4A, the second conducting line 25' does not fully overlap with the first conducting line 12 because the second conducting line mask (not illustrated) has been misaligned.

Figure 4B:
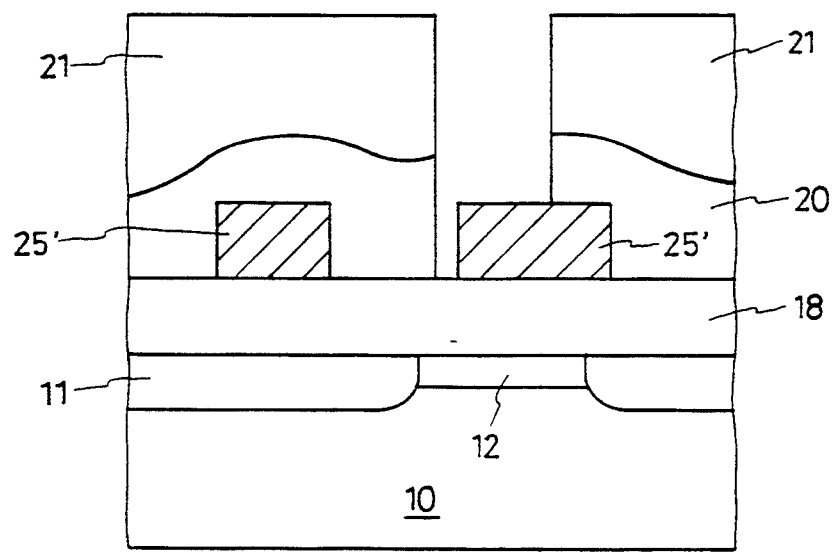

In FIG. 4B, a photoresist pattern 21 for contact mask is formed on top of the second insulating layer 20 and then, the second insulating layer 20 of contact area is etched to expose a part of the second conducting line 25' and the first insulating layer 18. Since the second conducting line 25' is misaligned, the contact area of photoresist pattern 21 for contact mask does not fully overlap with the second conducting line 25'.

Figure 4C:
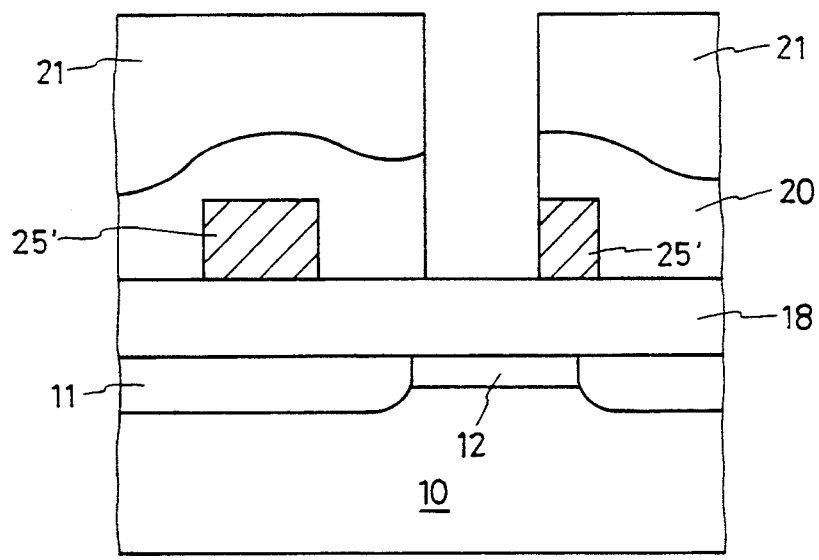

The exposed second conducting line 25' is etched using the photoresist pattern 21 as a mask and the first insulating layer 18 is exposed as shown in FIG. 4C. It should be noted that the second conducting line 25' not to be exposed at the contact hole has not been etched.

Figure 4D:
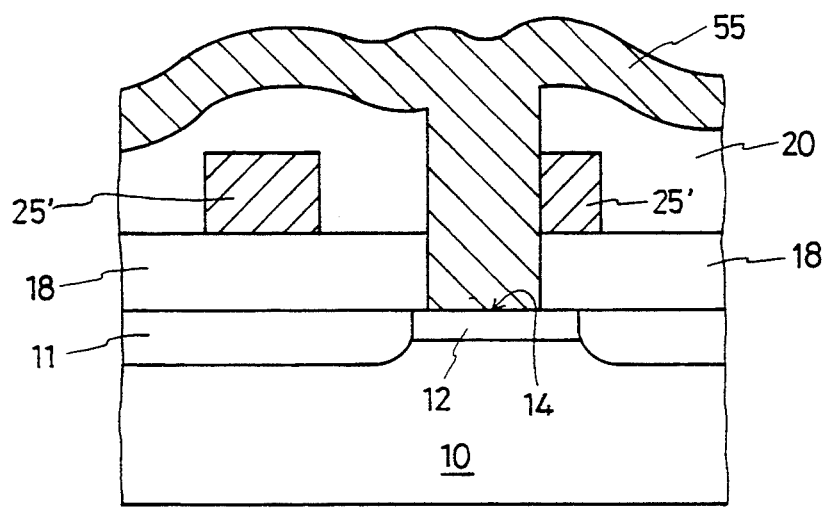

Next, referring to FIG. 4D, a contact hole 14 with the exposed first conducting line 12 is formed by etching the first insulating layer 18 that became exposed after carrying out the process described in FIG. 4C. Thereafter, the photoresist pattern 21 for contact mask is removed and then a third conducting layer 55, for example, polysilicon layer, is deposited on top of the entire structure to make it contact with the exposed first conducting line 12, and at the same time, making a contact with the second conducting line 25'. Alternatively, the third conducting layer 55 can be formed with a selective tungsten layer so that the tungsten layer is filled only into the contact hole.

Figure 4E:
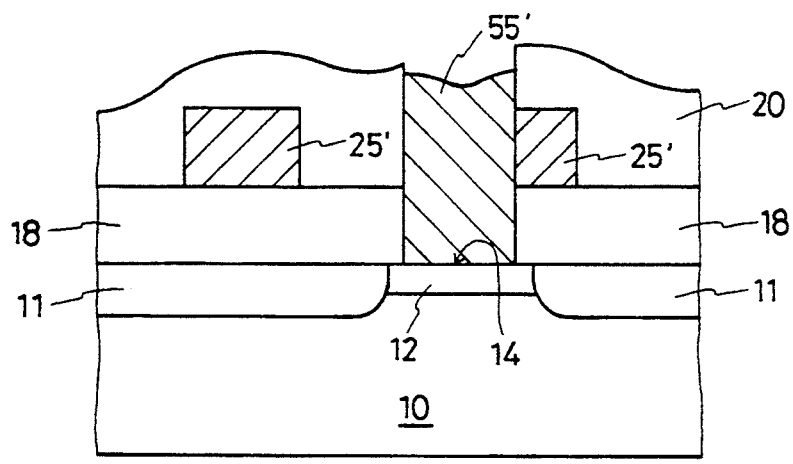

The third conducting layer 55 is etched back until the second insulating layer 20 is exposed in order to leave said third conducting layer on the contact hole to form a contact plug 55' as shown in FIG. 4E. The second conducting line 12 can be contacted to the first conducting line 12 through the contact plug 55' of the third conducting layer without damaging the first conducting line 12.

Figure 5:
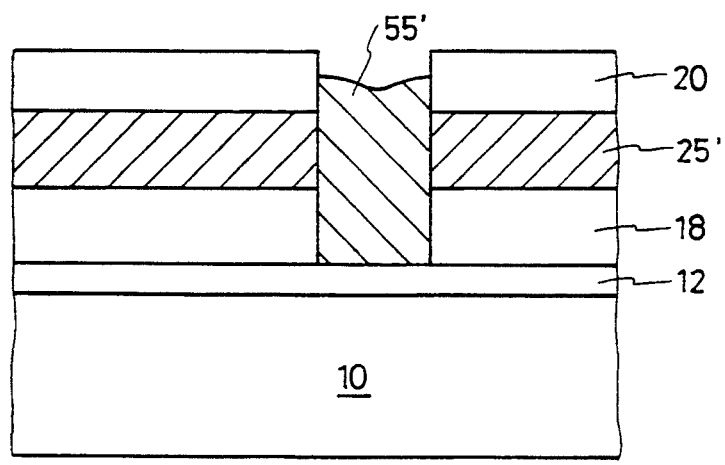
FIG. 5 is a cross-sectional view shown along II—II of FIG. 2B illustrating the contact that has been manufactured according to the present invention.

FIG. 5 is a cross-sectional view of the semiconductor device shown along II—II of FIG. 2B after finishing the process depicted in FIG. 4E. The second conducting line 25' is contacted to the first conducting line 12 by the contact plug 55' of the third conducting layer.

As described above, the present invention minimizes the line width of the second conducting line that is formed on top of the contact area when the second conducting line is contacted to the lower pair of the first conducting line and, at the same time, prevents damages from occurring on the first conducting line for an improved integrity of semiconductor device.

What is claimed is:

1. A method for reducing the width of conducting line of semiconductor device comprising the steps of:
    forming a first conducting line on a semiconductor substrate which has a field oxide and an exposed region formed by an opening in the field oxide, wherein said first conducting line is formed in said exposed region;
    forming a first insulating layer over the top of said first conducting line and semiconductor substrate;
    depositing a second conducting layer over the top of said first insulating layer and forming a second conducting line through a patterning process using a mask for the second conducting layer, said second conducting line being parallel to said first conducting line and having a width over at least a portion of its length that is no greater than the width of the underlying first conducting line;
    forming a second insulating layer over the semiconductor substrate;
    forming a photoresist pattern for a contact mask on the second insulating layer;
    etching a contact area in the second insulating layer by using said photoresist pattern as a mask to expose the second conducting line in the portion of its length that is no wider than the underlying first conducting line;
    sequentially etching the second conducting line and the first insulating layer that had been exposed at the contact area to create a contact hole that exposes a portion of the first conducting line;
    removing the photoresist pattern; and
    filling a third conducting layer for contact plug into the contact hole in order to make the first conducting line contact with the second conducting line.

2. The method of claim 1 wherein the step of filling the third conducting layer for contact plug into the contact hole comprises the steps of:
    depositing the third conducting layer on the contact hole and second insulating layer; and etching back said third conducting layer until the second insulating layer is exposed.

3. The method of claim 1, wherein said third conducting layer comprises a polysilicon.

4. The method of claim 1, wherein said third conducting layer is formed with a selective tungsten layer.

5. The method of claim 1, wherein the second conducting line is not fully overlapped with the contact hole which is formed on top of the second conducting line.

6. The method of claim 6, wherein said first conducting line is formed by injecting dopants into the exposed region of the semiconductor substrate.

* * * * *